(12) United States Patent
Van Fleet et al.

(10) Patent No.: US 6,190,433 B1
(45) Date of Patent: Feb. 20, 2001

(54) METHOD OF RECOVERING A GATE-LEVEL NETLIST FROM A TRANSISTOR-LEVEL

(75) Inventors: W. Mark Van Fleet, Glen Burnie; Michael R. Dransfield, Ellicott City, both of MD (US)

(73) Assignee: The United States of America as represented by the National Security Agency, Washington, DC (US)

( * ) Notice: Under 35 U.S.C. 154(b), the term of this patent shall be extended for 0 days.

(21) Appl. No.: 09/188,387

(22) Filed: Nov. 10, 1998

(51) Int. Cl.$^7$ .............................. G06F 17/10; G06F 7/60; G06F 17/50

(52) U.S. Cl. .................................. 71/18; 703/13; 703/14; 703/15; 703/2; 716/5; 716/12; 716/18

(58) Field of Search ................................ 700/97; 716/18; 703/2

(56) References Cited

U.S. PATENT DOCUMENTS

| | | | |
|---|---|---|---|
| 5,438,524 | * | 8/1995 | Komoda .................................. 716/18 |
| 5,677,848 | * | 10/1997 | Singh et al. .............................. 703/2 |
| 5,712,792 | * | 1/1998 | Yamashita et al. ..................... 716/18 |
| 5,734,572 | * | 3/1998 | Guignet .................................. 700/97 |

OTHER PUBLICATIONS

Pandey, M. et al, "Extraction of finite state machines from transistor netlists by symbolic simulation", IEEE Conference on Computer Design: VLSI in Computers and Processors, pp. 596–601 Oct. 1995.*

Bryant, R, "Extraction of Gate Level Models from Transistor Circuits by Four–Valued Symbolic Analysis", IEEE Proceedings of International Conference on Computer–Aided Design, pp. 350–353, 1991.*

* cited by examiner

Primary Examiner—Matthew Smith
Assistant Examiner—Jibreel Speight
(74) Attorney, Agent, or Firm—Robert D. Morelli

(57) ABSTRACT

The present invention is a method of recovering a gate-level netlist from a transistor-level netlist by functionally describing each gate to be recovered using a first transistor model; generating a signature for each gate to be recovered; receiving the transistor-level netlist; selecting a set of connected components from the transistor-level netlist; functionally describing the set of connected components using the first transistor model; generating a signature for the set of connected components; comparing the signature of the set of connected components to the signature of each gate to be recovered; if the signature of the set of connected components matches a signature of a to be recovered then determining if the corresponding functional descriptions match; if a match occurs then functionally describing the set of connected components using a second transistor model; comparing the functional descriptions generated for the set of connected components using the first and second transistor models; identifying the set of connected components as a gate to be recovered if its signature and functional description match those of a gate to be recovered and the functional descriptions of the set of connected components based on the first and second transistor models match; and redoing these steps if there is another set of connected components that is unidentified or a gate-level description at a higher level of abstraction is desired.

17 Claims, 7 Drawing Sheets

Microfiche Appendix Included
(1 Microfiche, 56 Pages)

1. GENERATE A FUNCTIONAL DESCRIPTION FOR EACH GATE TO BE RECOVERED USING A FIRST TRANSISTOR MODEL
2. GENERATE A SIGNATURE FOR EACH GATE TO BE RECOVERED
3. RECEIVE A TRANSISTOR-LEVEL NETLIST
4. SELECT A SET OF CONNECTED COMPONENTS FROM THE NETLIST
5. GENERATE A FUNCTIONAL DESCRIPTION OF THE SET OF CONNECTED COMPONENTS USING A FIRST TRANSISTOR MODEL
6. GENERATE A SIGNATURE FOR THE SET OF CONNECTED COMPONENTS
7. COMPARING THE SIGNATURES OF THE SECOND AND SIXTH STEPS
8. IF A MATCH OCCURRED IN THE LAST STEP THEN DETERMINE IF THE FUNCTIONAL DESCRIPTIONS OF THE FIFTH STEP AND THE FIRST STEP FOR WHICH A MATCH OCCURRED
9. IF A MATCH OCCURRED IN THE LAST STEP THEN GENERATE A FUNCTIONAL DESCRIPTION OF THE SET OF CONNECTED COMPONENTS USING A SECOND TRANSISTOR MODEL
10. IF THE LAST STEP WAS PERFORMED THEN COMPARE THE FUNCTIONAL DESCRIPTIONS OF THE SET OF CONNECTED COMPONENTS
11. IF A MATCH OCCURRED IN THE LAST STEP THEN IDENTIFY THE SET OF CONNECTED COMPONENTS AS THE GATE FOR WHICH A MATCH OCCURRED
12. RETURN TO THE FOURTH STEP IF THERE ARE OTHER SETS OF CONNECTED COMPONENTS TO PROCESS OR A HIGHER LEVEL OF ABSTRACTION IS DESIRED

FIG. 1

| IN1 | IN2 | OUT |
|---|---|---|
| 0 | 0 | 1 |
| 0 | 1 | 1 |
| 1 | 0 | 1 |
| 1 | 1 | 0 |

FIG. 2

| IN1 | IN2 | OUT | VALIDITY |
|---|---|---|---|
| 0 | 0 | 0 | I |
| 0 | 0 | 1 | V |
| 0 | 1 | 0 | I |
| 0 | 1 | 1 | V |
| 1 | 0 | 0 | I |
| 1 | 0 | 1 | V |
| 1 | 1 | 0 | V |
| 1 | 1 | 1 | I |

FIG. 3

| IN1 | IN2 | NODE | OUT | VALIDITY |
|---|---|---|---|---|
| 0 | 0 | 0 | 0 | I |
| 0 | 0 | 0 | 1 | I |
| 0 | 0 | 1 | 0 | V |
| 0 | 0 | 1 | 1 | I |
| 0 | 1 | 0 | 0 | I |
| 0 | 1 | 0 | 1 | I |
| 0 | 1 | 1 | 0 | I |
| 0 | 1 | 1 | 1 | V |
| 1 | 0 | 0 | 0 | I |
| 1 | 0 | 0 | 1 | V |
| 1 | 0 | 1 | 0 | I |
| 1 | 0 | 1 | 1 | I |
| 1 | 1 | 0 | 0 | V |
| 1 | 1 | 0 | 1 | I |
| 1 | 1 | 1 | 0 | I |
| 1 | 1 | 1 | 1 | I |

| IN1 | IN2 | OUT | VALIDITY |
|-----|-----|-----|----------|
| 0 | 0 | 0 | I |
| 0 | 0 | 1 | I |
| 0 | 1 | 0 | V |
| 0 | 1 | 1 | I |
| 1 | 0 | 0 | I |
| 1 | 0 | 1 | I |
| 1 | 1 | 0 | I |
| 1 | 1 | 1 | V |

METHOD OF RECOVERING A GATE-LEVEL NETLIST FROM A TRANSISTOR-LEVEL

FIELD OF THE INVENTION

The present invention relates, in general, to electrical computers and data processing systems and, in particular, to electronic engineering integrated circuit design and analysis.

BACKGROUND OF THE INVENTION

Electronic components include transistors, resistors, capacitors, and so on. Transistors come in various types (e.g., NMOS transistors, PMOS transistors, etc.). Electronic components may be connected to form an electronic circuit. Electronic circuits may be constructed to perform an analog function or a digital function. Electronic circuits are often integrated onto one piece of semiconductor material. Such a circuit is commonly referred to as an integrated circuit. Integrated circuits come in various forms such as custom designs, standard cell designs, gate array, field programable gate arrays, and so on.

A list of the electronic components that make up an integrated circuit is often useful for testing, debugging, archiving, and so on. The vast majority of integrated circuits manufactured today implement a digital circuit. Digital circuits may be constructed using just transistors. Therefore, a description of the transistors used in an integrated circuit and how they are connected together may fully describe the integrated circuit. Such a description is often referred to as a transistor-level netlist.

Initially, integrated circuits included a small number of transistors. Such integrated circuits are referred to as small scale integration (SSI). As the number of transistors increased, a number of levels of integration were crossed (e.g., medium scale integration (MSI), large scale integration (LSI), very large scale integration (VLSI), etc.). As the number of transistors grew, it became increasingly more difficult to convey the function of an integrated circuit by describing transistor connectivity. The level of abstraction was too low. A person viewing a dense transistor-level netlist may become overwhelmed with the details and lose sight of the big picture. It is not uncommon to have an integrated circuit contain over one million transistors. Trying to determine the functionality of such a circuit based on a transistor-level netlist would be very difficult, time-consuming, tedious, and prone to error. A higher level of abstraction is needed to describe such electronic circuits.

PMOS and NMOS transistors may be arranged to form all of the digital logic functions, or gates, such as the NAND gate, the NOR gate, the XNOR gate, etc. Digital logic gates are used to construct the vast majority of integrated circuits being manufactured today. Four, six, eight, or more transistors may be required to implement a particular gate. An abstraction was created for each gate so that a transistor-level description was no longer required to describe a gate. Gate-level abstractions may also be used to describe higher-level circuits (e.g., FLIP-FLOP, central processing unit, arithmetic logic unit, etc.). A higher-level circuit may be referred to as a macro.

Various computer-aided design tools have been created to quickly and accurately analyze an integrated circuit based on a transistor-level netlist and the physical implementation, or layout, of the integrated circuit. In many instances, the layout of the integrated circuit is not available. It may have been lost, never generated, or unavailable to a person doing reverse engineering. So, there is a need for a method of recovering a gate-level netlist from a transistor-level netlist of an integrated circuit where layout information of the gates included on the integrated circuit is unknown. The present invention is such a method.

U.S. Pat. No. 5,734,572, entitled "TOOL WHICH AUTOMATICALLY PRODUCES AN ABSTRACT SPECIFICATION OF A PHYSICAL SYSTEM AND A PROCESS FOR PRODUCING A PHYSICAL SYSTEM USING SUCH A TOOL," discloses a method of producing a functional description of an electronic circuit from the components of the integrated circuits and the interconnections between these components. It appears that the method of U.S. Pat. No. 5,734,572 requires that the exact implementation of a function be known before its function may be identified. The present invention does not require that the exact circuit implementation of a function be known before that function may be identified. The method of U.S. Pat. No. 5,734,572 appears to employ straight pattern matching between each function of the integrated circuit design and a library of known circuit implementations. The present invention does not require a library of known circuit implementations in order to identify functions of interest. U.S. Pat. No. 5,734,572 is hereby incorporated by reference into the specification of the present invention.

U.S. Pat. No. 5,438,524, entitled "LOGIC SYNTHESIZER"; and U.S. Pat. No. 5,712,792, entitled "LOGIC CIRCUIT SYNTHESIZING METHOD UTILIZING BINARY DECISION DIAGRAM EXPLORED BASED UPON HIERARCHY OF CORRELATION BETWEEN INPUT VARIABLES"; each disclose a method of generating a layout for an integrated circuit from a functional description of the integrated circuit using pre-existing layouts for each function. The methods of U.S. Pat. Nos. 5,438,524 and 5,712,792 each create an integrated circuit layout from a functional description whereas the method of the present invention starts with a layout of an integrated circuit in transistor netlist form and generates a gate-level netlist therefrom. U.S. Pat. Nos. 5,438,524 and 5,712,792 are hereby incorporated by reference into the specification of the present invention.

Microfiche Appendix

All computer programs necessary to make and use the present invention are included in a microfiche appendix which has been submitted with this specification to the United States Patent and Trademark Office. The microfiche appendix consists of one microfiche sheets and a total of fifty-six frames.

SUMMARY OF THE INVENTION

It is an object of the present invention to recover a gate-level netlist from a transistor-level netlist of an integrated circuit, where layout information of the gates in the integrated circuit is unknown.

It is an another object of the present invention to recover a gate-level netlist from a transistor-level netlist of an integrated circuit, where layout information of the gates in the integrated circuit is unknown, using functional descriptions of the gates to be recovered.

It is an another object of the present invention to recover a gate-level netlist from a transistor-level netlist of an integrated circuit, where layout information of the gates in the integrated circuit is unknown, using functional descriptions of the gates to be recovered, and where every instance of a particular gate function irrespective of circuit implementation will be recovered using just one functional description of the gate function in question.

The present invention is a method of recovering a gate-level netlist from a transistor-level netlist description of an integrated circuit where layout information for the gates contained in the integrated circuit is not known. This is accomplished by comparing a functional description of every gate function of interest to a functional description of a set of connected components selected from a transistor-level netlist. Different circuit implementations of a particular gate function may be recovered using a single functional description of the gate function in question.

The first step of the method is generating a functional description for each gate to be recovered using a first transistor model.

The second step of the method is generating a signature for each gate to be recovered.

The third step of the method is receiving a transistor-level netlist of an electronic circuit.

The fourth step of the method is selecting a set of connected components from the transistor-level netlist which has not been identified as one of the gates to be recovered.

The fifth step of the method is generating a functional description of the set of connected components using a first transistor model.

The sixth step of the method is generating a signature for the set of connected components.

The seventh step of the method is comparing the signature generated in the sixth step to each signature generated in the second step.

If in the seventh step the signature of the set of connected components matches the signature of one of the gates to be recovered, then the eighth step of the method is determining if the functional description of the set of connected components is the same as the functional description of the gate to be recovered for which a signature match was made.

If in the eighth step the functional description of the set of connected components is the same as the functional description of one of the gates to be recovered then the ninth step of the method is generating a functional description of the set of connected components using a second transistor model.

If the ninth step is performed, then the tenth step of the method is comparing the functional description of the set of connected components based on the first transistor model to the functional description of the set of connected components based on the second transistor model.

If the tenth step is performed and a match occurs then the eleventh step of the method is identifying the set of connected components as the gate for which matches occurred in the seventh, eighth, and tenth steps.

If there is another set of connected components that hasn't been identified as a gate or if a higher-level circuit is desired to be recovered from the gates identified then return to the fourth step, otherwise stop.

BRIEF DESCRIPTION OF THE DRAWINGS

FIG. 1 is a list of the steps of the present invention;

FIG. 2 is a truth-table of a two-input NAND gate;

FIG. 3 is an exhaustive table of combinations of logic values for the inputs and output of a two-input NAND gate that includes a column that indicates whether or not a particular combination of logic values is valid;

DETAILED DESCRIPTION

Figure 4:
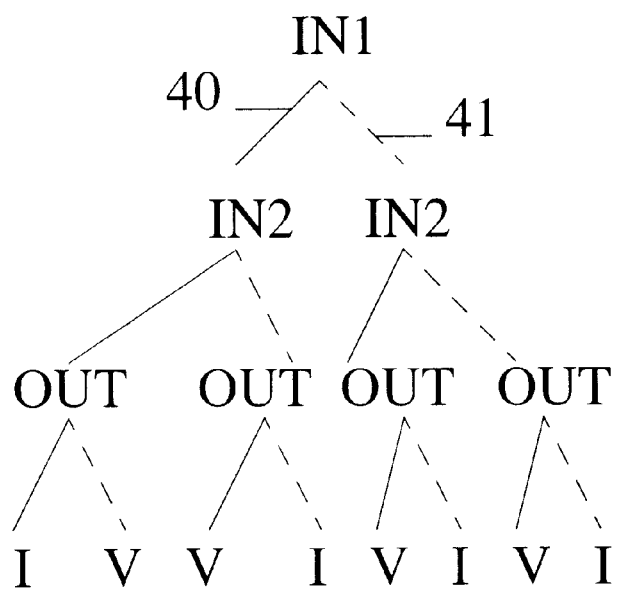
FIG. 4 is a binary decision diagram for a two-input NAND gate.

The present invention is a method of recovering a gate-level netlist from a transistor-level netlist of an electronic circuit (e.g., an integrated circuit), where the physical layouts of the gates contained in the electronic circuit are not known. A particular gate function may be implemented in a number of ways, using different numbers of transistors and vastly different connectivity schemes. The method of the present invention may be used to recover different circuit implementations of a gate function using a single functional description of that gate function.

A gate-level description of an integrated circuit more readily conveys the functionality of an integrated circuit than does a description of the lowest level components contained therein (e.g., transistors, resistors, capacitors, etc.). Most integrated circuits contain only PMOS and NMOS transistors. Therefore, the present invention will be described using just these transistors. However, the present invention also applies to netlists that contain any type of electrical component.

FIG. 1 is a list of the steps in the method of the present invention.

The first step 1 of the method is generating a functional description for each gate to be recovered. Essentially, a library is created that contains a functional description for each gate that is desired to be recovered from a transistor-level netlist. The library should include all of the low gates that one would expect to encounter in an integrated circuit (e.g., AND, NAND, OR, NOR, XOR, etc.). The library may also include higher level functions, or macros, that may be constructed from low-level gates and transistors (e.g., FLIP-FLOPS, RAM, ROM, etc.).

The first transistor model is a model of a PMOS transistor and an NMOS transistor. The source and drain terminals of the PMOS transistor are considered connected when the gate terminal of the PMOS transistor is at a logic value of 0 and are considered disconnected otherwise. The source and drain terminals of the NMOS transistor are considered connected when the gate terminal of the NMOS transistor is at a logic value of 1 and are considered disconnected otherwise. The first transistor model is one where either a PMOS transistor or an NMOS transistor may be configured to pass either a logic value of 1 or a logic value of 0.

The functional description of a gate may come in different forms (e.g., table, binary decision diagram, system of non-linear equations, etc.), but each description must describe all combinations of logic values or relationships for the inputs, outputs, and state-holding nodes of the gate. A state-holding node is a node that is internal to a gate that can hold a particular value (e.g., one side of a cross-coupled inverter in a FLIP-FLOP). The functional description must also convey whether or not a particular combination of logic values is possible (i.e., valid).

For example, a two-input NAND gate has two inputs, one output, and no state-holding nodes. FIG. 2 shows the traditional truth-table for a two-input NAND gate that lists all possible combinations of values that may be applied to just the inputs (i.e., 00, 01, 10, and 11) and only the corresponding correct, or valid, logic values that may appear at the output (i.e., 1110). The truth-table of FIG. 2 does not include all possible combinations of inputs and outputs and, therefore, does not describe the function of a two-input NAND gate as required by the present invention.

FIG. 3 shows a table for a two-input NAND gate that does describe the two-input NAND gate as required by the present invention. The table of FIG. 3 lists all possible combinations of logic values for not only the inputs but also for the output. The table of FIG. 3 includes an extra column to indicate whether or not a particular combination of logic values for the inputs and output is valid. Typically, a validity column uses a 0 to indicate that a particular combination of logic values is invalid and a 1 to indicate that a particular combination of logic values is valid. This may be fine for digital computers and those familiar with such a table, but everyone else may be confused by the use of 0 and 1 in the table for two different purposes (i.e., for indicating the logic value of the inputs and outputs and for indicating validity of the various logic value combinations). To avoid confusion, the letter "I" will be used in the present invention to indicate that a particular logic value combination is invalid and the letter "V" will be used to indicate that a particular logic value combination is valid. It can be seen that only the entries in the truth-table of FIG. 2 are listed as valid in FIG. 3.

Instead of using a table, a gate function may be described as required by the present invention using a binary decision diagram. A binary decision diagram is a tree diagram that includes inputs, outputs, and state-holding nodes. The order of these variables does not matter except that a variable may only appear in one level of the tree and in no other level. FIG. 4 is binary decision diagram describing the two-input NAND gate of FIG. 3. The solid lines 40 connecting one variable to another indicates that the variable at the top of the solid line takes on the logic value 1 (e.g., IN1=1). The dashed lines 41 connecting one variable to another indicates that the variable on top takes on the logic value 0 (e.g., IN1=0). The lowest level in the tree represents the accumulation of all of the logic values along the path to a lowest level in the diagram. A letter appears at each point in the lowest level of the binary decision diagram to indicate whether of not the logic value combination represented by a particular point in the lowest level of the tree is valid. For example, the left-most branch in the tree, at which appears an I, indicates that IN1=1, IN2=1, OUT=1, is an invalid logic value combination for a two-input NAND gate. The same result is depicted in FIG. 3 as the last line in the table. The branch to the right of the left-most branch, at which appears a V, indicates that IN1=1, IN2=1, OUT=0, is a valid logic value combination for a two-input NAND gate. The same result is depicted in the next-to-last line in the table of FIG. 3.

The ordering of the inputs, outputs, and state-holding nodes in the binary decision diagram doesn't matter, just as the ordering of the combinations in FIG. 3 doesn't matter. However, a convention has developed for such tables where the right-most variable is treated as the least significant bit, and where each variable to the left of another variable is more significant than its neighbor to the right by one bit position. Therefore, the left-most bit is treated as the most significant bit. A convention that generally reduces the size and complexity of a binary decision diagram is to order the variables in the following order: control inputs, state-holding nodes, data inputs, and outputs.

Figure 5:
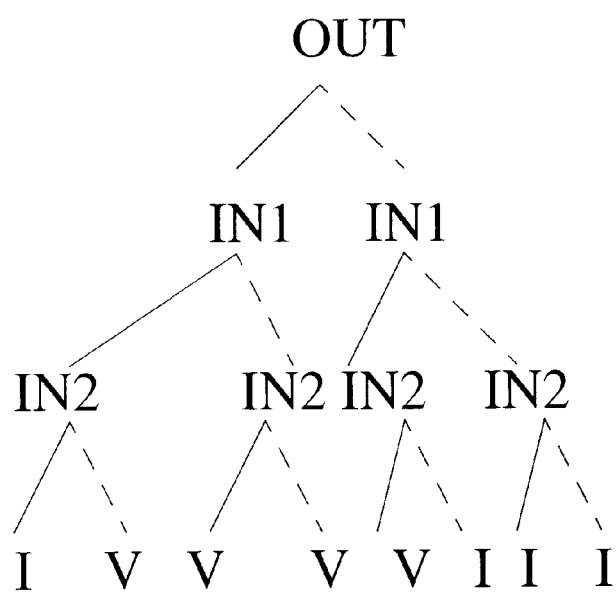
FIG. 5 is a binary decision diagram of a two-input NAND gate with variable ordering different than the variable ordering used in FIG. 4.

To illustrate the point that order doesn't matter in a binary decision tree, FIG. 5 describes the two-input NAND gate of FIG. 4 using a different variable ordering. The same description is obtained. That is, the same logic value combinations are found to be valid.

Figure 6:
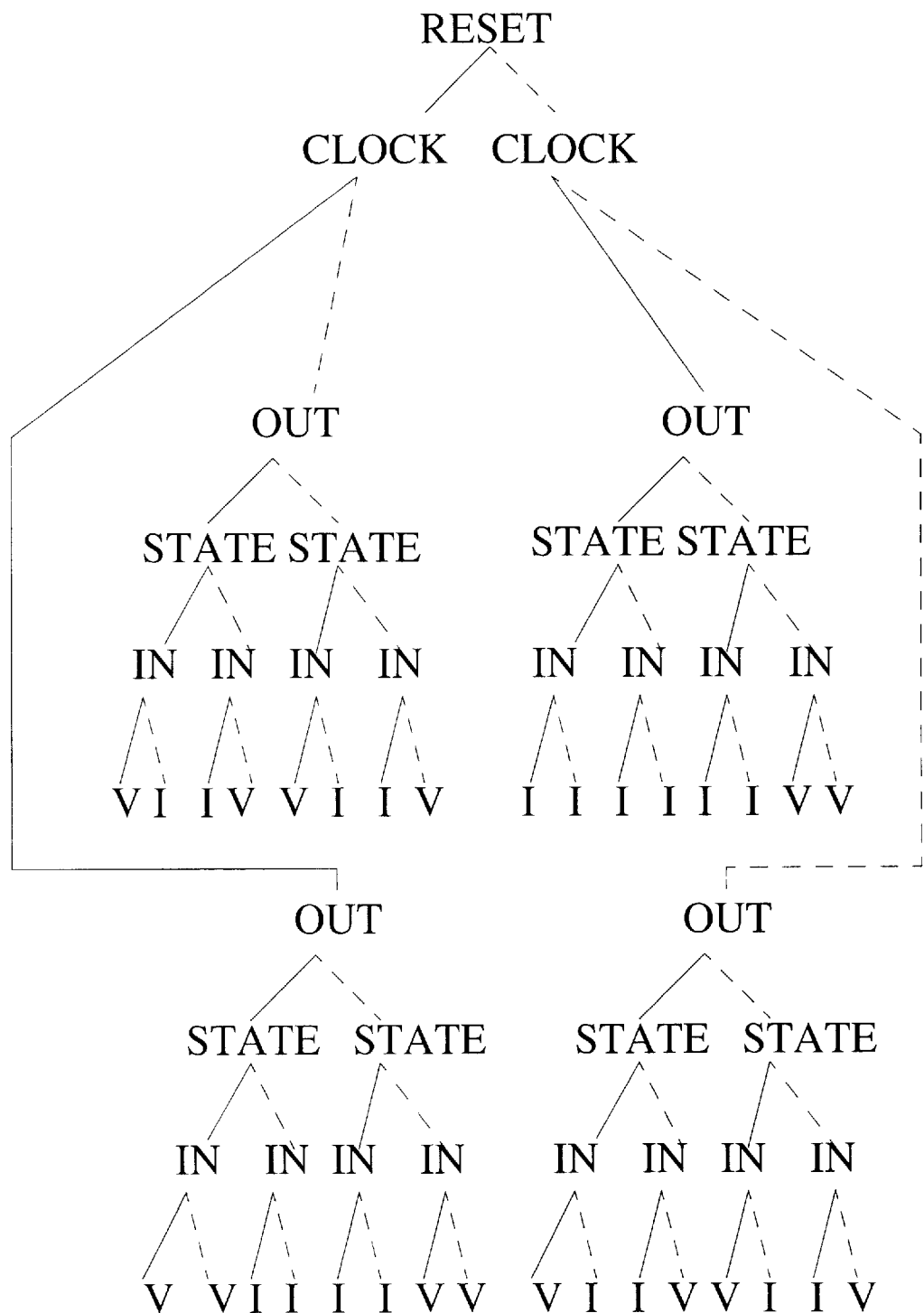
FIG. 6 is a binary decision diagram of a FLIP-FLOP.

FIG. 6 is a binary decision diagram of a FLIP-FLOP with a positive-triggered clock input and a negative-triggered reset input in the form of a binary decision diagram. Note the state-holding node of the FLIP-FLOP is identified as "STATE."

The second step 2 of the method listed in FIG. 1 is generating a signature for each gate for which a functional description was generated in the first step 1. A signature for a gate is a set of numbers based on the functional description of the gate.

One of the numbers in a signature for a gate is the number of inputs, outputs, and state-holding nodes associated with the gate. For example, the two-input NAND described in FIG. 3 has two inputs, one output, and no state-holding nodes. Therefore, one number in a signature of the two-input NAND gate is the number three. The FLIP-FLOP of FIG. 6 has three inputs, one output, and one state-holding node. Therefore, one number in the signature of the FLIP-FLOP is the number five.

Another number in the signature of a gate is the number of logic value combinations that are valid. This number would be four for the two-input NAND gate described in FIGS. 3, 4, and 5. This number would be fourteen for the FLIP-FLOP described in FIG. 6.

Figure 7:
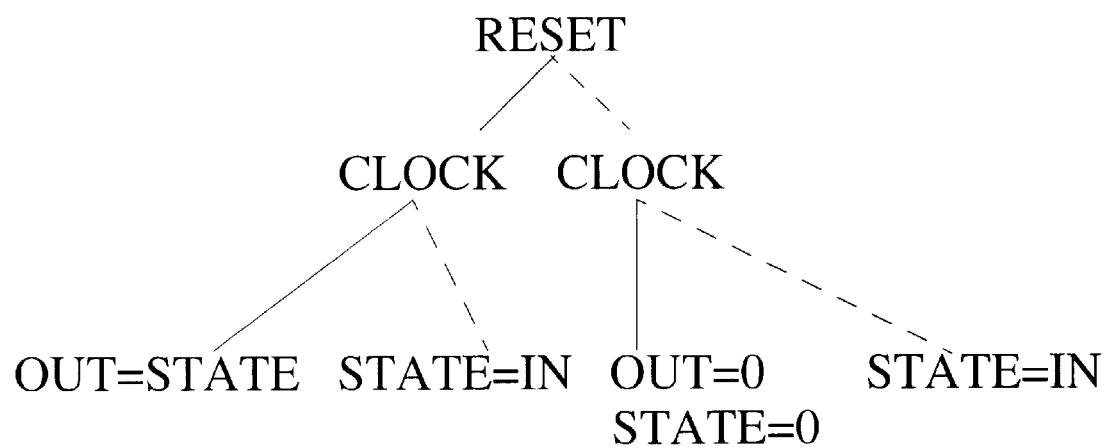
FIG. 7 is a higher level binary decision diagram of the FLIP-FLOP of FIG. 6.

FIG. 7 is a higher level binary decision diagram of the FLIP-FLOP of FIG. 6.

Other numbers in a signature for a gate include a number for each input, output, and state-holding node, where each number represents the probability that an input, output, or state-holding node has a logic value of 1 when that logic value combination is valid. Each number is generated by first determining the number of times that the input, output, or state-holding node in question is a logic value 1 when the corresponding logic value combinations are valid and then dividing this number by the total number of valid combinations in the description of the gate to arrive at the signature number for that particular input, output, or state-holding node. For example, input IN1 in the two-input NAND gate described in FIGS. 3, 4, and 5 is a logic value 1 in a valid combination two times (i.e., the sixth and seventh entries in FIG. 3, the second and third entries from left to right in the lowest-level in the tree diagram of FIG. 4, and the second and fifth entries from left to right in the lowest-level in the tree diagram of FIG. 5). The total number of valid combinations in the description of the two-input NAND gate is four. Therefore, the number for input IN1 is $2/4=0.5$. Input IN2 in the two-input NAND gate described in FIGS. 3, 4, and 5 is a logic value 1 in a valid combination two times (i.e., the fourth and seventh entries in FIG. 3, the second and fifth entries from left to right in the lowest-level in the tree diagram of FIG. 4, and the third and fifth entries from left to right in the lowest-level in the tree diagram of FIG. 5).

Therefore, the number for input IN2 is ⅖=0.5. Output OUT in the two-input NAND gate described in FIGS. 3, 4, and 5 is a logic value 1 in a valid combination three times (i.e., the second, fourth, and sixth entries in FIG. 3, the second, third, and fifth entries from left to right in the lowest-level in the tree diagram of FIG. 4, and the second, third, and fourth entries from left to right in the lowest-level in the tree diagram of FIG. 5). Therefore, the number for output OUT is ¾=0.75.

So, the signature for the two-input NAND gate of FIGS. 3, 4, and 5 is (3, 4, 0.5, 0.5, 0.75).

For the FLIP-FLOP example of FIG. 6, input RESET is a logic value 1 in a valid combination eight times (i.e., the first, second, seventh, eighth, ninth, twelfth, thirteenth, and sixteenth entries from left to right in FIG. 6). The total number of valid logic value combinations in the description of the FLIP-FLOP is fourteen. Therefore, the number for input RESET is 8/14=0.57. Input CLOCK is a logic value 1 in a valid logic combination six times (i.e., the first, second, seventh, eighth, twenty-third, and twenty-fourth entries from left to right in FIG. 6). Therefore, the number for input CLOCK is 6/14=0.43. Output OUT is a logic value 1 in a valid logic combination six times (i.e., the first, second, ninth, twelfth, twenty-fifth, and twenty-eighth entries from left to right in FIG. 6). Therefore, the number for output OUT is 6/14=0.43. State-holding node STATE is a logic value 1 in a valid logic combination six times (i.e., the first, second, ninth, thirteenth, twenty-fifth, and twenty-ninth entries from left to right in FIG. 6). Therefore, the number for state-holding node STATE is 6/14=0.43. Input IN is a logic value 1 in a valid logic combination seven times (i.e., the first, seventh, ninth, thirteenth, twenty-third, twenty-fifth, and twenty-ninth entries from left to right in FIG. 6). Therefore, the number for input IN is 7/14=0.50.

So, the signature for the FLIP-FLOP in FIG. 6 is (5, 14, 0.57, 0.43, 0.43, 0.43, 0.5).

The third step 3 of the method listed in FIG. 1 is receiving a transistor-level netlist of an electronic circuit from which a gate-level netlist is desired to be recovered.

The fourth step 4 of the method listed in FIG. 1 is selecting a set of connected components, which has not been identified as a gate function, from the transistor-level netlist. Any reasonable method of selecting a set of connected components may be employed in the present invention. In some integrated circuits (e.g., custom designed integrated circuits) blocks of circuitry are readily discernible without necessarily knowing what gates are contained therein (e.g., RAM, ROM, control section, etc.). Less than an entire block may be selected. For example, a user-defined region within the integrated circuit may be selected. Also, a particular node may be selected. If a block or user-defined region is selected then more than one set of connected components may be contained therein. In the present invention one set of connected components is processed at a time. Any reasonable method of ordering the processing of multiple sets of connected components may be employed in the present invention. If a node is selected, the user may specify the range (e.g., distance, area, etc.) in which a set of connected components is constrained. This prevents the entire integrated circuit from being identified as one set of connected components which would be just as difficult to work with as the original transistor-level netlist.

The fifth step 5 of the method listed in FIG. 1 is generating a functional description of the set of connected components selected in the fourth step 4 using the first transistor model. This is accomplished by replacing each PMOS and NMOS transistor in the netlist of the set of connected components with its corresponding first transistor model described above. Next, a boolean equation is written for each transistor, gate, or macro. The set of boolean equations is then solved to find the functional description of the set of connected components (e.g., a table as in FIG. 3 or a binary decision diagram as in FIG. 4). The functional description would initially include every node in the set of connected components. This initial functional description is then reduced so that only inputs, outputs, and state-holding nodes, if any, are included in the functional description of the set of connected components.

Figures 8, 9:
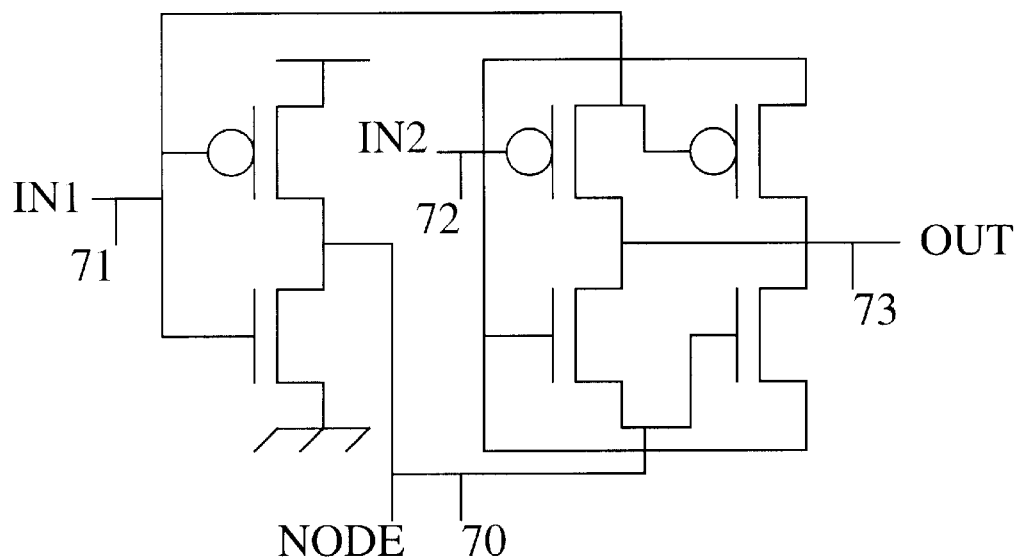
FIG. 8 is a schematic of one possible circuit implementation of a two-input XOR gate.
FIG. 9 is an exhaustive table of logic values for all the nodes of a two-input XOR gate that includes a column that indicates whether or not a particular combination of logic values is valid.

For example, the set of connected components may be a two-input XOR gate as shown in the schematic of FIG. 8. Ignoring power and ground connections, which are ignored in a truth-table description of a gate, there is one extra node NODE 70 in the two-input XOR gate other than the two inputs IN1 71 and IN2 72 and the output OUT 73. There are no state-holding nodes in the two-input XOR gate. A functional description of the two-input XOR gate may be generated that includes, or does not include, the extra node NODE 70. To include the extra node NODE 70 in a functional description of the two-input XOR gate, either include it as a variable in the table of exhaustive logic value combinations or add the extra node NODE 70 as a level in a binary decision diagram. To exclude the extra node NODE 70, consider the extra node NODE 70 in determining the functionality of the set of connected components for the two-input XOR gate, but do not include it in the table or binary decision diagram that describes the functionality of the gate. Any other reasonable method of reducing a functional description that includes an extra node in order to obtain a functional description that includes only inputs, outputs, and state-holding nodes may be employed in the present invention.

Figures 10, 11:
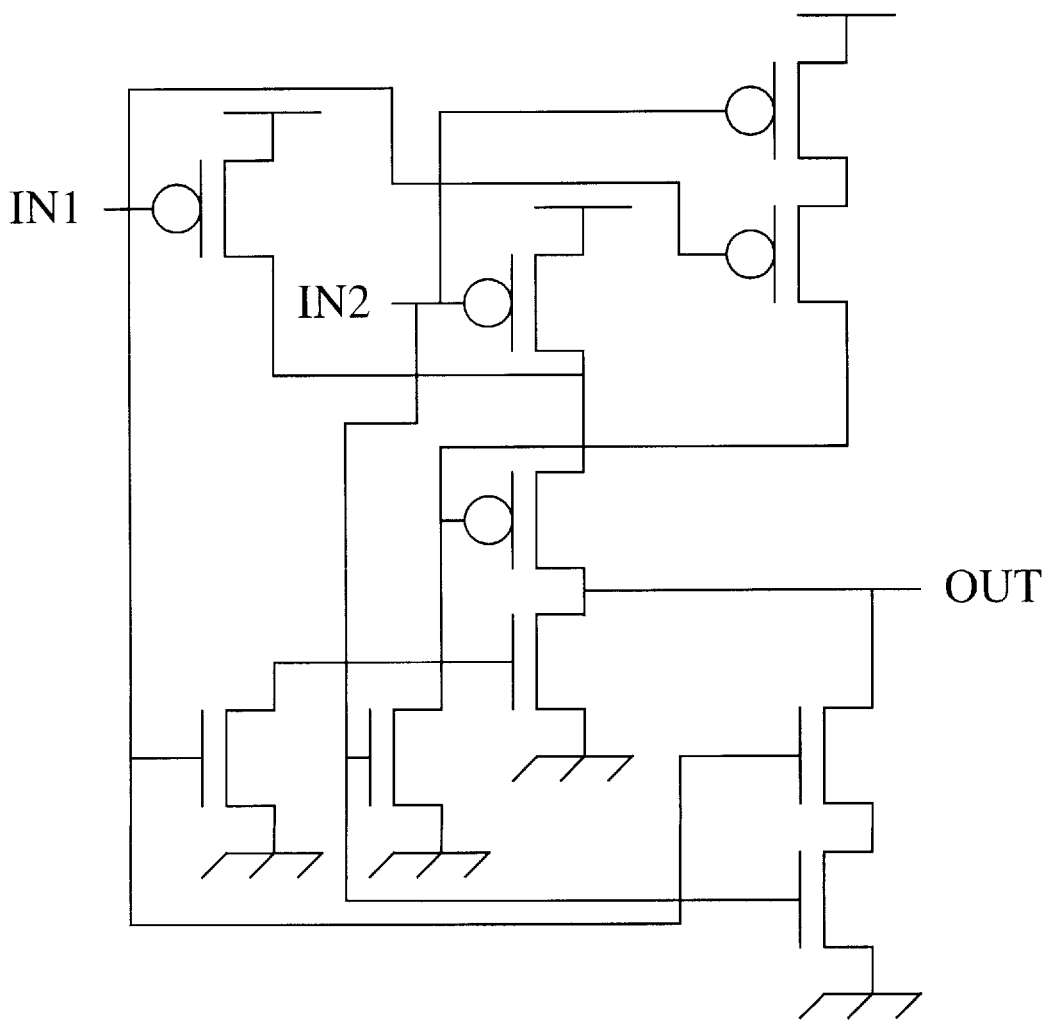
FIG. 10 is the table of FIG. 9 reduced to include only inputs, outputs, state-holding nodes, and the validity column.
FIG. 11 is a schematic of another possible circuit implementation of a two-input XOR gate.

The sixth step 6 of the method listed in FIG. 1 is generating a signature for the set of connected components in the same manner as signatures where generated in the second step 2 for the gates to be recovered. FIG. 9 is a table that describes the functionality of the two-input XOR gate with the extra node NODE 70 included. FIG. 10 is a table that describes the functionality of the two-input XOR gate without listing the extra node NODE 70. The number of inputs and outputs in the two-input XOR gate is three. The number of valid logic value combinations for the inputs and outputs is four. The number of times IN1 is a logic value 1 when the corresponding logic combinations are valid is two. Therefore, the number for IN1 is ⅖=0.5. The same number is arrived at for both IN2 and OUT. Therefore, the signature for the two-input XOR gate of FIG. 8 is (3, 4, 0.5, 0.5, 0.5).

To illustrate how two different circuit implementations of the same gate can generate the same signature, a schematic of a second circuit implementation of a two-input XOR gate is shown in FIG. 11. The two-input XOR gate of FIG. 11 includes four extra nodes (i.e., N1 100, N2 101, N3 102, and N4 103) in addition to the two inputs (i.e., IN1 104 and IN2 105) and the output (i.e., OUT 106). A functional description of the two-input XOR gate of FIG. 11 in table form would include 128 entries while a binary decision diagram would have eight levels, where the last level of the binary decision diagram indicates validity. A functional description of a seven variable table or tree is not shown in a figure because of its size. Such a functional description may be reduced to the functional description shown in FIG. 10. Since the two-input XOR gates of FIGS. 8 and 10 each have two inputs, one output, and the same functional description after reduction, the two-input XOR gates will have the same signature.

The seventh step 7 of the method listed in FIG. 1 is comparing the signature generated in the sixth step 6 to each signature generated in the second step 2.

If in the seventh step 7 the signature of the set of connected components matches the signature of one of the gates to be recovered then the eighth step 8 of the method listed in FIG. 1 is determining if the functional description of the set of connected components is the same as the functional description of the gate to be recovered for which a signature match occurred. This is accomplished by checking to see if the functional description of the set of connected components (e.g., table or binary decision diagram) is identical (or can be manipulated in some fashion to be identical without changing the function being described) to the functional description of the gate to be recovered for which a signature match occurred. Manipulation of a functional description entails making the order of the inputs, outputs, and state-holding nodes in the functional description of the set of connected components the same as the order of these same variables in the functional description of the gate for which a signature match occurred. The function being described remains the same, but its appearance may be different depending upon the ordering of the variables. For example, the binary decision diagrams of FIGS. 4 and 5 describe the same two-input NAND gate, but appear different because the variable ordering is different. So, if the functional description of the set of connected components does not literally match the functional description of the gate to be recovered for which a signature match occurred then the functional description of the set of connected components is manipulated to see if a different variable ordering will produce the same functional description as the gate in question. Manipulation may also entail making sure that the logic value ordering is the same for the two functional descriptions (e.g., the right-most variable is treated as the low order bit in both functional descriptions etc.).

If in the eighth step 8 the functional description of the set of connected components is the same as the functional description of the gate to be recovered for which a signature match occurred then the ninth step 9 of the method listed in FIG. 1 is generating a functional description of the set of connected components using a second transistor model. In the second transistor model, the source and drain terminals of the PMOS transistor are considered connected when the gate terminal of the PMOS transistor is at a logic value of 0, are considered disconnected otherwise, and the source terminal is at a logic value of 1. The source and drain terminals of the NMOS transistor are considered connected when the gate terminal of the NMOS transistor takes on a logic value of 1, are considered disconnected otherwise, and the drain terminal is at a logic value of 0. In the second transistor model, the PMOS traistor only passes a logic value of 1 and the NMOS transistor only passes a logic value of 0. Essentially, the transistors of the set of selected components used to generate the functional description in the fifth step 5 using the first transistor model is duplicated. Each transistor in the duplicated set of connected components is then replaced by its counterpart in the second transistor model. A functional description is then generated for the set of connected components using the second transistor model in the same manner as was done in the fifth step 5.

If the ninth step 9 is performed, then the tenth step 10 of the method listed in FIG. 1 is comparing the functional description of the set of connected components based on the first transistor model to the functional description of the set of connected components based on the second transistor model. If the two functional descriptions do not match then the source and drain terminals of one or more second model transistor are swapped. A functional description for this new configuration is then generated and compared to the functional description of the set of connected components based on the first transistor model. If the two functional descriptions still do not match then the source and drain terminals of a different set of second model transistors is swapped. A functional description is then generated for this new configuration and compared to the functional description of the set of connected components based on the first transistor model. The manipulation of the second transistor model circuit continues as described above until either the functional descriptions match or every conceivable permutation of the second transistor model circuit is exhausted.

If the tenth step 10 is performed and a match of functional descriptions is found then the eleventh step 11 of the method listed in FIG. 1 is identifying the set of connected components as the gate for which matches occurred in the seventh step 7, the eighth step 8, and the tenth step 10.

If there is another set of connected components in the integrated circuit that hasn't been identified as a particular gate, or a higher level circuit is desired to be recovered, then the eleventh step 11 of the method listed in FIG. 1 is returning to the fourth step 4 for processing of another, or the same, set of connected components, otherwise stop.

On a first pass of the present invention over a section of an integrated circuit, all of the low-level gates contained therein will be identified (e.g., inverters, NAND gates, NOR gates, etc.). If a user wishes to identify higher-level functions that are built out of low-level gates and described in the library of gates to be recovered (e.g., cross-coupled inverters as a one-bit static memory cell, FLIP-FLOPs, arithmetic logic units, etc.) then the present method is performed another time on that section of the integrated circuit thought to contain a higher-level circuit. Once a gate is identified, then the set of connected components is identified as that gate and there is no need to consider those connected components again. The gate abstraction associated with a set of connected components is used from then on to represent that set of connected components and is used as a component in any subsequent searches for higher level circuits.

What is claimed is:

1. A method of recovering a gate-level netlist from a transistor-level netlist, comprising the steps of:

a) generating a functional description for each gate to be recovered using a first transistor model;

b) generating a signature for each gate to be recovered;

c) receiving the transistor-level netlist;

d) selecting a set of connected components from the transistor-level netlist;

e) generating a functional description for the set of connected components using the first transistor model;

f) generating a signature for the set of connected components;

g) comparing the signature of the set of connected components to the signature of each gate to be recovered;

h) comparing the functional description of the set of connected components to the functional description of the gate to be recovered for which a match occurred in step (g);

i) generating a functional description of the set of connected components using a second transistor model if a match occurred in step (h);

j) comparing the functional description of the set of connected components based on the first transistor model to the functional description for the set of connected components based on the second transistor model if a functional description of the set of connected components based on the second transistor model was generated;

k) identifying the set of connected components as the gate for which its signature matches, its functional description matches, and its functional description based on a first transistor model matches its functional description based on the second transistor model; and l) returning to step (d) if another gate at any abstraction level is desired to be recovered, otherwise stop.

2. The method of claim 1, wherein said step of generating a functional description for each gate to be recovered is comprised of generating a functional description for each gate to be recovered that includes an exhaustive list of logic values for only inputs, outputs, and state-holding nodes along with an indicator of whether or not a particular combination of logic values is valid.

3. The method of claim 1, wherein said step of generating a functional description for each gate to be recovered using a first transistor model is comprised of generating a functional description for each gate to be recovered using a transistor model for a PMOS transistor and an NMOS transistor, where the source and drain terminals of the PMOS transistor are considered connected when the gate terminal of the PMOS transistor is at a logic value of 0 and are considered disconnected otherwise, and where the source and drain terminals of the NMOS transistor are considered connected when the gate terminal of the NMOS transistor is at a logic value of 1 and are considered disconnected otherwise.

4. The method of claim 1, wherein said step of generating a signature for each gate to be recovered is comprised of generating, for each gate to be recovered, a series of numbers where one of the numbers represents the number of inputs, outputs, and state-holding nodes of the gate to be recovered; where another number represents the number of valid logic value combinations in the functional description of the gate to be recovered; and where a number for each input, output, and state-holding node is computed by determining the number of times the particular input, output, or state-holding node is a logic value of 1 in the functional description of the gate to be recovered when those particular logic value combinations are valid and dividing that number by the total number of valid logic value combinations in the functional description of the gate to be recovered.

5. The method of claim 1, wherein said step of generating a functional description of the set of connected components using a first transistor model is comprised of the steps of:

a) replacing each PMOS transistor in the set of connected components with a transistor model where the source and drain terminals are considered connected when the gate terminal is at a logic value of 0, and where the source and drain terminals are considered disconnected otherwise;

b) replacing each NMOS transistor in the set of connected components with a transistor model where the source and drain terminals are considered connected when the gate terminal is at a logic value of 1, and where the source and drain terminals are considered disconnected otherwise;

c) generating a boolean equation for each transistor replaced in step (a) and step (b);

d) solving the boolean equations generated in step (c); and e) reducing the result of step (d) so that the functional description includes an exhaustive list of logic values for only the inputs, outputs, and state-holding nodes of the set of connected components, and a validity indicator for each entry in the exhaustive list.

6. The method of claim 1, wherein said step of generating a signature for the set of connected components is comprised of generating a series of numbers where one of the numbers represents the number of inputs, outputs, and state-holding nodes; where another number represents the number of valid logic value combinations in the functional description of the set of connected components; and where a number for each input, output, and state-holding node is computed by determining the number of times the particular input, output, or state-holding node is a logic value of 1 in the functional description of the set of connected components when those particular logic value combinations are valid and dividing that number by the total number of valid logic value combinations in the functional description of the set of connected components.

7. The method of claim 1, wherein said step of comparing the functional description of the set of connected components to the functional description of the gate to be recovered for which a match occurred in step (g) further comprises the steps of:

a) manipulating the order of the inputs, outputs, and state-holding nodes in the functional description of the set of connected components;

b) determining if the functional description of the set of connected components is identical to the functional description of the gate to be recovered;

c) returning to step (a) unless a match was found is step (b) and unless the number of possible manipulations has been exhausted.

8. The method of claim 1, wherein said step of generating a functional description of the set of connected components using a second transistor model is comprised of the steps of:

a) replacing each PMOS transistor in the set of connected components with a transistor model where the source and drain terminals are considered connected when the gate terminal is at a logic value of 0, where the source and drain terminals are considered disconnected otherwise, and where the drain terminal is at a logic value of 1;

b) replacing each NMOS transistor in the set of connected components with a transistor model where the source and drain terminals are considered connected when the gate terminal is at a logic value of 1, where the source and drain terminals are considered disconnected otherwise, and where the drain terminal is at a logic value of 0;

c) generating a boolean equation for each transistor replaced in step (a) and step (b);

d) solving the boolean equations generated in step (c); and e) reducing the result of step (d) so that the functional description includes an exhaustive list of logic values for only the inputs, outputs, and state-holding nodes of the set of connected components, and a validity indicator for each entry in the exhaustive list.

9. The method of claim 1, wherein said step of comparing the functional description of the set of connected components based on the first transistor model to the functional description of the set of connected components based on the second transistor model further comprises the steps of:

a) swapping the drain and source terminals of various transistors replaced in the set of connected components where the second transistor model was used;

b) generating a boolean equation for each transistor in the set of connected components as modified by step (a);

c) solving the boolean equations generated in step (b);

d) reducing the result of step (c) so that the functional description includes an exhaustive list of logic values for only the inputs, outputs, and state-holding nodes of the set of connected components, and a validity indicator for each entry in the exhaustive list; and e) comparing the functional description of the set of connected components based on the first transistor model to the functional description of the set of connected components resulting from step (d).

10. The method of claim 2, wherein said step of generating a functional description for each gate to be recovered using a first transistor model is comprised of generating a functional description for each gate to be recovered using a transistor model for a PMOS transistor and an NMOS transistor, where the source and drain terminals of the PMOS transistor are considered connected when the gate terminal of the PMOS transistor is at a logic value of 0 and are considered disconnected otherwise, and where the source and drain terminals of the NMOS transistor are considered connected when the gate terminal of the NMOS transistor is at a logic value of 1 and are considered disconnected otherwise.

11. The method of claim 10, wherein said step of generating a signature for each gate to be recovered is comprised of generating, for each gate to be recovered, a series of numbers where one of the numbers represents the number of inputs, outputs, and state-holding nodes of the gate to be recovered; where another number represents the number of valid logic value combinations in the functional description of the gate to be recovered; and where a number for each input, output, and state-holding node is computed by determining the number of times the particular input, output, or state-holding node is a logic value of 1 in the functional description of the gate to be recovered when those particular logic value combinations are valid and dividing that number by the total number of valid logic value combinations in the functional description of the gate to be recovered.

12. The method of claim 11, wherein said step of generating a functional description of the set of connected components using a first transistor model is comprised of the steps of:

a) replacing each PMOS transistor in the set of connected components with a transistor model where the source and drain terminals are considered connected when the gate terminal is at a logic value of 0, and where the source and drain terminals are considered disconnected otherwise;

b) replacing each NMOS transistor in the set of connected components with a transistor model where the source and drain terminals are considered connected when the gate terminal is at a logic value of 1, and where the source and drain terminals are considered disconnected otherwise;

c) generating a boolean equation for each transistor replaced in step (a) and step (b);

d) solving the boolean equations generated in step (c); and e) reducing the result of step (d) so that the functional description includes an exhaustive list of logic values for only the inputs, outputs, and state-holding nodes of the set of connected components, and a validity indicator for each entry in the exhaustive list.

13. The method of claim 12, wherein said step of generating a signature for the set of connected components is comprised of generating a series of numbers where one of the numbers represents the number of inputs, outputs, and state-holding nodes; where another number represents the number of valid logic value combinations in the functional description of the set of connected components; and where a number for each input, output, and state-holding node is computed by determining the number of times the particular input, output, or state-holding node is a logic value of 1 in the functional description of the set of connected components when those particular logic value combinations are valid and dividing that number by the total number of valid logic value combinations in the functional description of the set of connected components.

14. The method of claim 13, wherein said step of comparing the functional description of the set of connected components to the functional description of the gate to be recovered for which a match occurred in step (g) further comprises the steps of:

a) manipulating the order of the inputs, outputs, and state-holding nodes in the functional description of the set of connected components;

b) determining if the functional description of the set of connected components is identical to the functional description of the gate to be recovered;

c) returning to step (a) unless a match was found is step (b) and unless the number of possible manipulations has been exhausted.

15. The method of claim 14, wherein said step of generating a functional description of the set of connected components using a second transistor model is comprised of the steps of:

a) replacing each PMOS transistor in the set of connected components with a transistor model where the source and drain terminals are considered connected when the gate terminal is at a logic value of 0, where the source and drain terminals are considered disconnected otherwise, and where the drain terminal is at a logic value of 1;

b) replacing each NMOS transistor in the set of connected components with a transistor model where the source and drain terminals are considered connected when the gate terminal is at a logic value of 1, where the source and drain terminals are considered disconnected otherwise, and where the drain terminal is at a logic value of 0;

c) generating a boolean equation for each transistor replaced in step (a) and step (b);

d) solving the boolean equations generated in step (c); and e) reducing the result of step (d) so that the functional description includes an exhaustive list of logic values for only the inputs, outputs, and state-holding nodes of the set of connected components, and a validity indicator for each entry in the exhaustive list.

16. The method of claim 15, wherein said step of comparing the functional description of the set of connected components based on the first transistor model to the functional description of the set of connected components based on the second transistor model further comprises the steps of:

a) swapping the drain and source terminals of various transistors replaced in the set of connected components where the second transistor model was used;

b) generating a boolean equation for each transistor in the set of connected components as modified by step (a);

c) solving the boolean equations generated in step (b);

d) reducing the result of step (c) so that the functional description includes an exhaustive list of logic values for only the inputs, outputs, and state-holding nodes of the set of connected components, and a validity indicator for each entry in the exhaustive list; and e) comparing the functional description of the set of connected components based on the first transistor model to the functional description of the set of connected components resulting from step (d).

17. A method of recovering a gate-level netlist from a transistor-level netlist, comprising the steps of:

a) generating a functional description for each gate to be recovered using a first transistor model;

b) generating a signature for each gate to be recovered, comprising the step of generating, for each gate to be recovered, a series of numbers where one of the numbers represents the number of inputs, outputs, and state-holding nodes of the gate to be recovered; where another number represents the number of valid logic value combinations in the functional description of the gate to be recovered; and where a number for each input, output, and state-holding node is computed by determining the number of times the particular input, output, or state-holding node is a logic value of 1 in the functional description of the gate to be recovered when those particular logic value combinations are valid and dividing that number by the total number of valid logic value combinations in the functional description of the gate to be recovered;

c) receiving the transistor-level netlist;

d) selecting a set of connected components from the transistor-level netlist;

e) generating a functional description for the set of connected components using the first transistor model;

f) generating a signature for the set of connected components, comprising the step of generating a series of numbers where one of the numbers represents the number of inputs, outputs, and state-holding nodes; where another number represents the number of valid logic value combinations in the functional description of the set of connected components; and where a number for each input, output, and state-holding node is computed by determining the number of times the particular input, output, or state-holding node is a logic value of 1 in the functional description of the set of connected components when those particular logic value combinations are valid and dividing that number by the total number of valid logic value combinations in the functional description of the set of connected components;

g) comparing the signature of the set of connected components to the signature of each gate to be recovered;

h) comparing the functional description of the set of connected components to the functional description of the gate to be recovered for which a match occurred in step (g);

i) generating a functional description of the set of connected components using a second transistor model if a match occurred in step (h);

j) comparing the functional description of the set of connected components based on the first transistor model to the functional description for the set of connected components based on the second transistor model if a functional description of the set of connected components based on the second transistor model was generated;

k) identifying the set of connected components as the gate for which its signature matches, its functional description matches, and its functional description based on a first transistor model matches its functional description based on the second transistor model; and l) returning to step (d) if another gate at any abstraction level is desired to be recovered, otherwise stop.

* * * * *